(12) United States Patent
Ikeda et al.

(10) Patent No.: US 6,396,758 B2
(45) Date of Patent: May 28, 2002

(54) SEMICONDUCTOR MEMORY DEVICE

(75) Inventors: Hitoshi Ikeda; Tatsuya Kanda; Yoshitaka Takahashi; Shinya Fujioka; Akihiro Funyu, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/793,603

(22) Filed: Feb. 27, 2001

(30) Foreign Application Priority Data

Feb. 29, 2000 (JP) ........................................ 2000-054882

(51) Int. Cl.$^7$ ................................................ G11C 7/00
(52) U.S. Cl. ................ 365/222; 365/189.07; 365/233.5
(58) Field of Search ............................ 365/222, 189.07, 365/233, 233.5

(56) References Cited

U.S. PATENT DOCUMENTS

| | | | | | |
|---|---|---|---|---|---|
| 5,761,136 A | * | 6/1998 | Park et al. | ................... | 365/222 |
| 6,134,169 A | * | 10/2000 | Tanaka | ........................ | 365/222 |
| 6,195,303 B1 | * | 2/2001 | Zheng | ........................ | 365/222 |
| 6,215,714 B1 | * | 4/2001 | Takamae et al. | ............ | 365/222 |

* cited by examiner

Primary Examiner—Son T. Dinh
(74) Attorney, Agent, or Firm—Arent Fox Kintner Plotkin & Kahn, PLLC

(57) ABSTRACT

A semiconductor memory device having a self-refresh operation includes a detection circuit generating a detection signal when detecting a change of a given input signal, and a comparator circuit comparing the detection signal with a refresh request signal internally generated and generating a control signal indicative of a circuit operation.

11 Claims, 13 Drawing Sheets

SEMICONDUCTOR MEMORY DEVICE

BACKGROUND OF THE INVENTION

1. Field of the Invention

The present invention generally relates to semiconductor memory devices, and more particularly to a semiconductor memory device of a DRAM (Dynamic Random Access Memory) type in which a self-refresh operation is constantly performed in the device.

2. Description of the Related Art

Recently, a compact mobile terminal such as a cellular phone has collaborated with the Internet and handled a large amount of data. This has stimulated a large-capacity memory. Nowadays, an SRAM (Static Random Access Memory) is employed in the cellular phones because of its low power consumption. However, the SRAM does not have a high integration density. The larger the SRAM capacity, the more expensive the cost. In contrast, the DRAM is a low-cost, high-capacity memory. The DRAM and SRAM do not have different command systems. This does not allow the SRAM to be simply interchanged with the DRAM. In this case, a major problem arises from a refresh operation of the DRAM. Data stored in memory cells of the DRAM will be lost unless the DRAM is periodically refreshed. The periodic refresh can be implemented by supplying a refresh command to the DRAM from a controller provided outside of the DRAM. However, this would apply a considerable load to the controller.

This needs a periodic refresh that is spontaneously performed within the DRAM. Such a periodic refresh is called self-refresh. If the DRAM is of asynchronous type and operates independently of a clock supplied thereto, a refresh request signal that is internally generated may collide with a request for an active operation (such as a data write or read operation) that is supplied from the outside of the DRAM.

FIG. 1 is a block diagram of a part of a core peripheral part of a conventional asynchronous DRAM. FIG. 2 is a timing chart of an operation of the configuration shown in FIG. 1.

Referring to FIG. 1, the DRAM includes a filter 10, a command control circuit 11, a refresh (REF) control circuit 12, a refresh-active (REF-ACT) comparator circuit 13, and a core control circuit 14. The REF control circuit 12 periodically supplies the REF-ACT comparator circuit 13 and the core control circuit 14 with a refresh (REF) request signal refpz. A read or write command that is supplied from the outside of the DRAM is applied to the command control circuit 11 via the filter 10. The read or write command is defined by a combination of control signals (command signals) such as a chip enable signal /CE, a write enable signal /WE, and an output enable signal /OE. The symbol "/" denotes an active-low signal. The filter 10 filters the command signals /CE, /WE and /OE in order to avoid malfunction of the asynchronous type DRAM due to noise. The command control circuit 11 decodes the command received via the filter 10,ad an active (ACT) request signal (that requests activation of the core) actpz to the REF-ACT comparator circuit 13 and the core control circuit 14.

The REF-ACT comparator circuit 13 selects one of the ACT request signal actpz and the REF request signal refpz that has been received earlier, and outputs a resultant REF-ACT selection signal refz to the core control circuit 14. If the refresh operation is selected, the REF-ACT selection signal refz is at a high (H) level (FIG. 2(b)). In contrast, if the ACT request signal is selected, the REF-ACT selection signal refz is at a low (L) level (FIG. 2(a)). The core control circuit 14 receives either the ACT request signal actpz or the REF request signal refpz, and operates a core (not shown for the sake of simplicity). While the core is operating, the core control circuit 14 outputs a busy signal busyz to the REF-ACT comparator circuit 13 to thus prevent the REF-ACT selection signal from switching over. If the REF request signal refpz is applied during the active operation (read or write operation), of if the ACT request signal actpz is input during the refresh operation, the later input operation is caused to wait for completion of the former input operation, and is then allowed when the former input operation is completed, that is, the busy signal busyz is switched to the L level.

FIG. 3 is circuit diagram of the REF-ACT comparator circuit 13. The circuit 13 includes inverters 15 and 16, NAND gates 17 and 18, a transfer switch 19, a latch 20 and an inverter 21. The NAND gates 17 and 18 form a flip-flop. When the ACT request signal actpz is applied to the comparator circuit 13, an output n1 of the NAND gate 17 is switched to L and an output n2 of the NAND gate 18 are both switched to H. In contrast, when the REF request signal refpz is input to the circuit 13, the output n1 is H, and the output n2 is L. When the busy signal busyz from the core control circuit 14 is L, the transfer switch 19 is ON, and n1=n3 (the output of the switch 19)=refz. In contrast when the busy signal busyz is H, the transfer switch 19 is OFF, and the output refz of the inverter 21 does not change.

FIG. 4 is a circuit diagram of a configuration of the core control circuit 14. The circuit 14 includes inverters 22, 27, 28 and 29, and NAND gates 23, 24, 25, 26, 30, 31, 32, 33 and 34. The NAND gates 23 and 24 form a flip-flop FF1, and the NAND gates 30 and 31 form a flip-flop FF2. A core control signal out, which is the output of the NAND gate 34, is output to a circuit part (not shown) involved in control of the core. When the core control signal out is H, the control of the core is started, and the busy signal busyz is switched to H. The NAND gates 26 and 32 receive the busy signal busyz. When the ACT request signal actpz and the REF request signal refpz are applied, the outputs n2 and n1 of the flip-flops FF2 and FF1 become H. When the busy signal busyz is L, the core control signal out is H. When the busy signal busyz is H, the output control signal out is L.

When the active operation is initiated (busyz=H, refz=L), the flip-flop FF2 is reset and N2=L. When the refresh operation is initiated (busyz=H, refz=H), the flip-flop FF1 is reset and N1=L. If the ACT request command actpz is applied during the refresh operation, the circuit waits for completion of the refresh operation with n2=H. When the refresh operation is completed and the busy signal busyz is switched to L, the H level of the node n2 acts as the core control signal out, and the active operation is initiated. The circuit operates in the same manner as described above when the refresh request signal refpz is applied during the active operation.

The access time in the above-mentioned control is the longest in a case where the ACT request signal is output immediately after the REF request signal refpz is applied. The longest access time needs the longest time it takes to output data. FIG. 5 is a timing chart of the above case. The access time shown in FIG. 5 is the total of the time it takes for the ACT request signal actpz to be output from an access command is input (the chip enable signal /CE switches to L, the time of the refresh operation, and the time it takes for data to be output after the ACT request signal actpz is applied.

The asynchronous type DRAM independent of the external clock needs the filter 10 to prevent the DRAM from malfunctioning due to noise that may be superimposed on the control signals such as /CE, /WE and /OE and the address signal. The signals that have passed through the filter 10 are applied to the internal circuits of the DRAM. For example, the ACT request signal actpz is generated from the signals that have passed through the filter 10. It is necessary to delay the signals by at least 1 ns in order to avoid noise equal to 1 ns. Thus, if it is attempted to eliminate noise having a relatively long width, the filter 10 is required to have a long delay. This lengthens the access time until requested data is read out from the DRAM after the corresponding command is applied thereto.

SUMMARY OF THE INVENTION

It is a general object of the present invention to provide a semiconductor memory device in which the above disadvantages are eliminated.

A more specific object of the present invention is to provide a semiconductor memory device having a reduced access time.

The above objects of the present invention are achieved by a semiconductor memory device having a self-refresh operation comprising: a detection circuit generating a detection signal when detecting a change of a given input signal; and a comparator circuit comparing the detection signal with a refresh request signal internally generated and generating a control signal indicative of a circuit operation. When a change of the given signal is detected, an instruction about a circuit operation of the semiconductor memory device may be applied thereto from the outside of the device. It takes a certain time to analyze and identify the instruction because it is necessary to eliminate noise from a signal describing the instruction and decode this signal. The detection signal is generated by detecting a change of the given input signal without performing the process for interpreting an instruction described by the given input signal. The detection signal is compared with the refresh request signal. Hence, a circuit operation that is to be executed can be selected promptly.

The above objects of the present invention are also achieved by a semiconductor memory device having a self-refresh operation comprising: a detection circuit generating a detection signal when detecting a change of a given input signal; and a refresh control circuit generating a refresh request signal that requests the self-refresh operation responsive to the detection signal in a test mode. The self-refresh operation can be instructed from the outside of the device. Hence, it is possible to easily detect the access time, which corresponds to the time until data is actually read from the device after a change of the given input signal.

BRIEF DESCRIPTION OF THE DRAWINGS

The other objects, features and advantages of the present invention will become more apparent from the following detailed description when read in conjunction with the accompanying drawings, in which.

DESCRIPTION OF THE PREFERRED EMBODIMENTS

Figure 5:
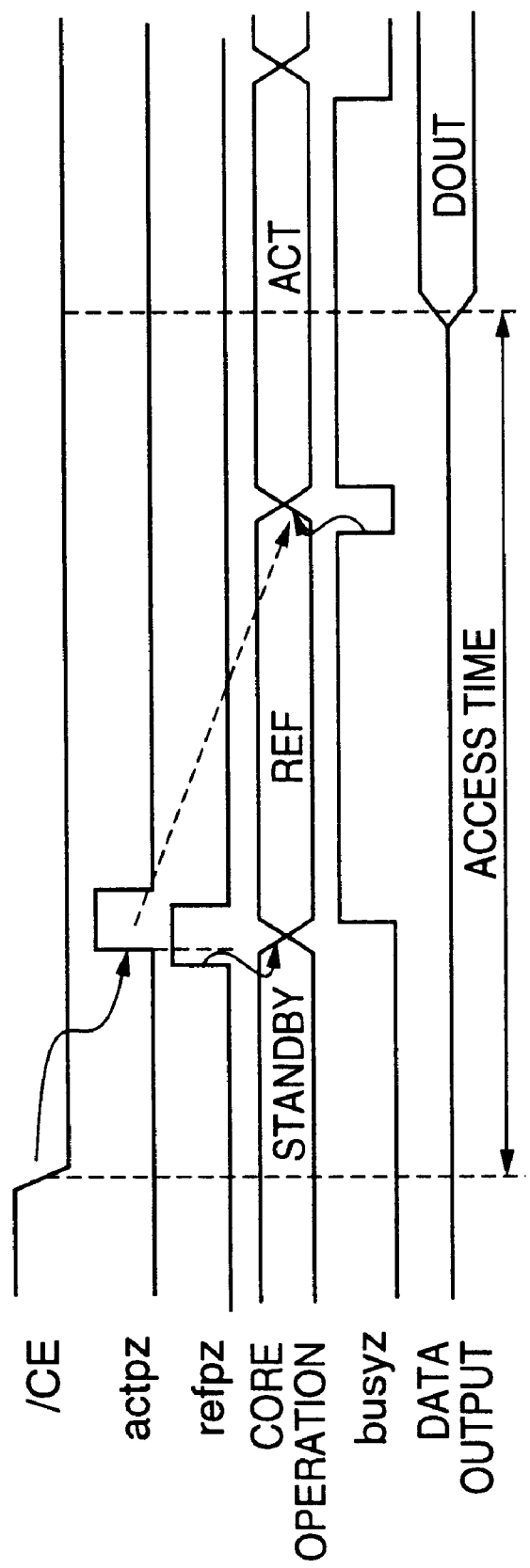
FIG. 5 is a timing chart for explaining the longest access time.
Figure 6:
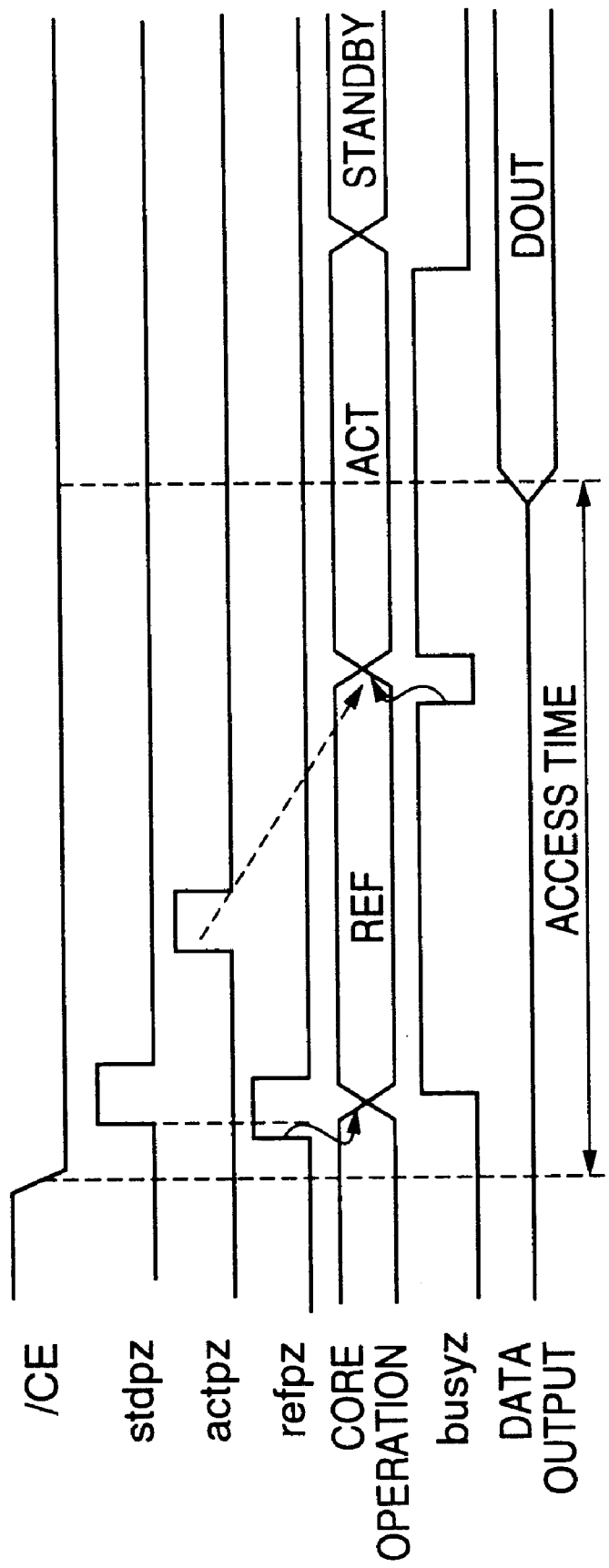
FIG. 6 is a timing chart of a principle of the present invention.

FIG. 6 is a timing chart illustrating the principle of the present invention. The timing chart of FIG. 6, which is associated with the timing chart of FIG. 5, principally shows an operation of a semiconductor memory device. According to one aspect of the present invention, a transition detection signal stdpz is newly introduced. The transition detection signal stdpz is generated when a transition is detected in any of the signals applied to the filter 10 shown in FIG. 1. As has been described with reference to FIG. 1, the filter 10 is supplied with the control signals /CE, /WE and /OE and the address signal. For example, the transition detection signal stdpz is generated when a transition is detected in any of the control signals and the address signal. In the example shown in FIG. 6, the chip enable signal /CE has a transition in which it changes from H to L.

The transition detection signal stdpz is compared with the REF request signal refpz in order to select an earlier one of these signals. In the example shown in FIG. 6, the REF request signal refpz slightly leads to the transition detection signal stdpz. Thus, the refresh operation is selected, and the active operation is started after the refresh operation is completed. It can be seen from comparison between the access time shown in FIG. 5 and that shown in FIG. 6 that the semiconductor memory device of the present invention has a shorter access time than the conventional device and operates faster. It is to be noted that the conventional circuit is designed so that the command control circuit 11 generates the ACT request signal actpz from the signals that have passed through the filter 10. In contrast, the transition detection signal stdpz is generated from the signals that do not pass through the filter 10. Hence, the present invention is capable of outputting data faster.

As has been described, the access time is the total of the time it takes for the transition detection signal stdpz to be output from the time when the access command is applied to the filter 10, the time of the refresh operation, and the time it takes for data to be output after the ACT request signal actpz is applied. The data outputting shown in FIG. 6 is faster than that shown in FIG. 5 by the time necessary for the ACT request signal to be output (equal to the delay of time by the filter 10) after the transition detection signal stdpz is output.

Figure 1:
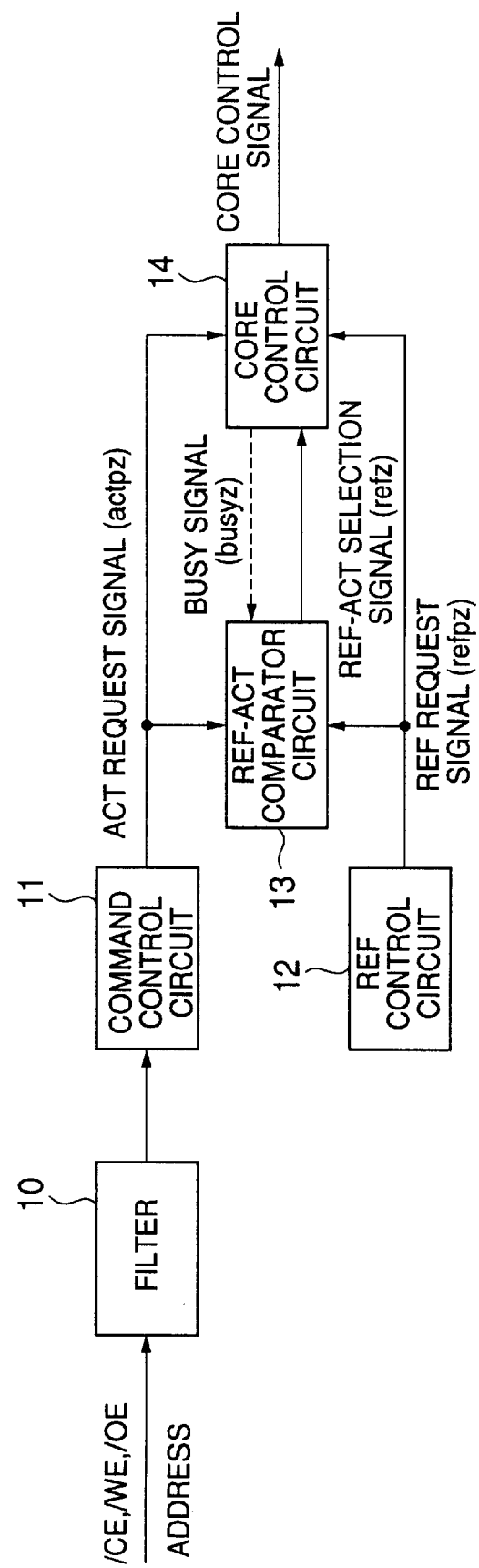
FIG. 1 is a block diagram of a part of a core peripheral circuit of a conventional DRAM.
Figure 2:
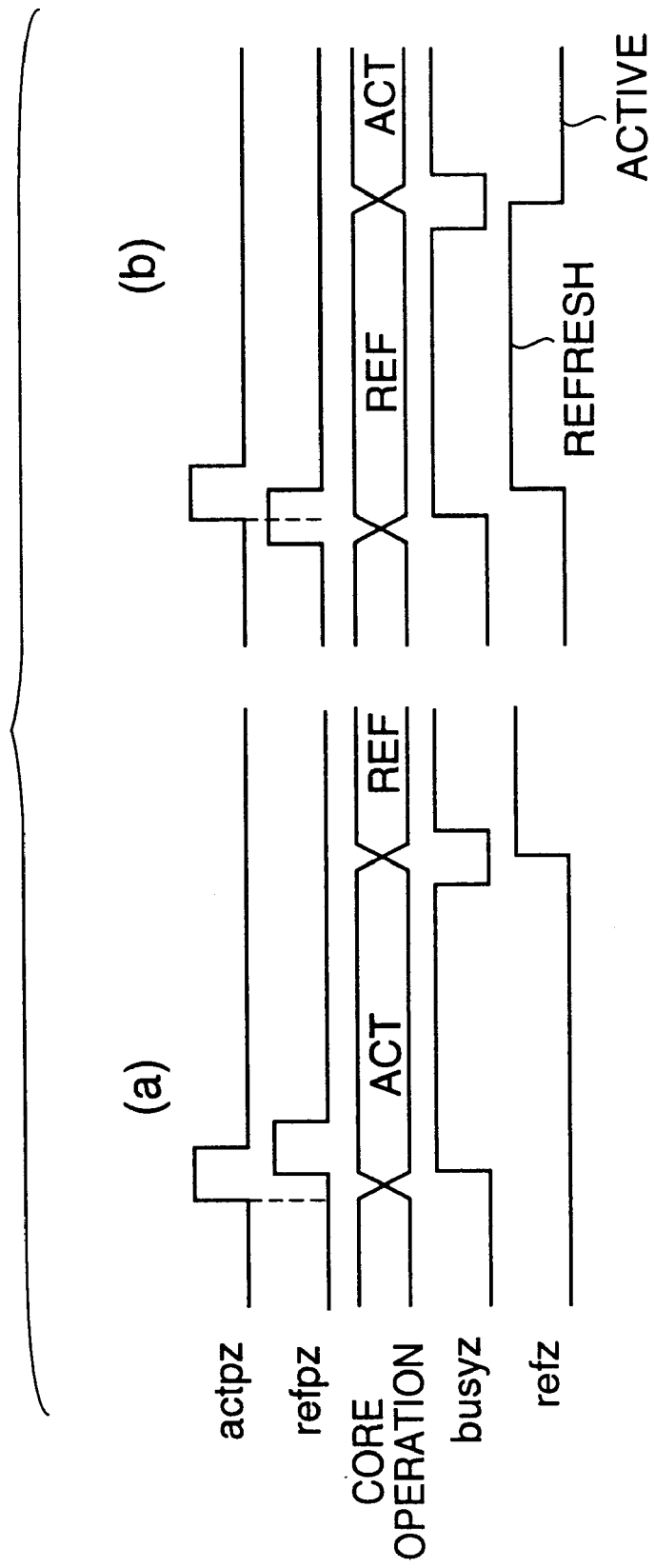
FIG. 2 is a timing chart of an operation of the configuration shown in FIG. 1.
Figure 7:
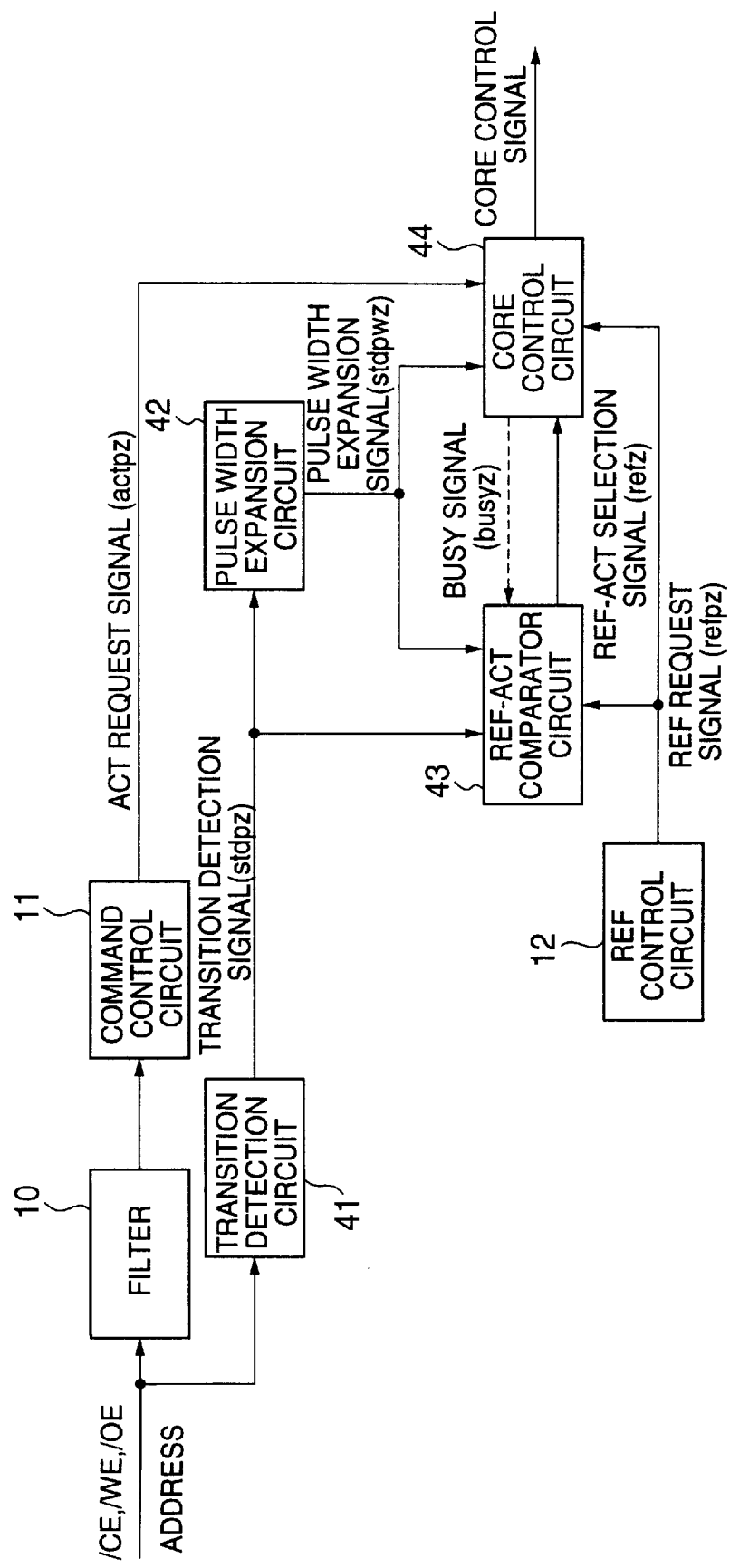
FIG. 7 is a block diagram of a first embodiment of the present invention.

FIG. 7 is a block diagram of a semiconductor memory device according to an embodiment of the present invention. In FIG. 7, parts that are the same as those shown in FIG. 1 are given the same reference numbers as previously. The semiconductor memory device shown in FIG. 7 includes the filter 10, the command control circuit 11, the REF control circuit 12, a transition detection circuit 41, a pulse width expansion circuit 42, a REF-ACT comparator circuit 43, and a core control circuit 44. The transition detection circuit 41 and the pulse width expansion circuit 42 are newly introduced by the present embodiment. The REF-ACT comparator circuit 43 and the core control circuit 44 have configurations different from those of the REF-ACT comparator circuit 13 and the core control circuit 14 shown in FIG. 1.

The transition detection circuit 41 generates the transition detection signal stdpz shown in FIG. 6. The detection subject signals are the input signals of the filer 10, namely, the control signals including the chip enable signal /CE, the write enable signal /WE and the output enable signal /OE, and the address signal. The transition detection circuit 41 detects a transition of a given bit in the control signals and the address signals. For example, the transition detection circuit 41 detects a change from H to L in any of the control signals /CE, /WE and /OE and a change from L to H or vice versa in the address signal. When such a transition is detected, the transition detection circuit 41 generates the transition detection signal stdpz. The transition detection signal stdpz is applied to the REF-ACT comparator circuit 44 and the pulse width expansion circuit 42. The REF-ACT comparator circuit 43 compares the transition detection signal stdpz with the REF request signal refpz, and outputs the resultant REF-ACT selection signal refz to the core control circuit 44. If the transition detection signal stdpz leads to the REF request signal refpz in terms of timing, the REF-ACT selection signal refz is L. In contrast, if the transition detection signal stdpz lags behind the REF request signal refpz, the REF-ACT selection signal refz is H. The ACT request signal actpz is generated from the signals that have passed through the filter 10 as in the case of FIG. 1.

Figure 8:
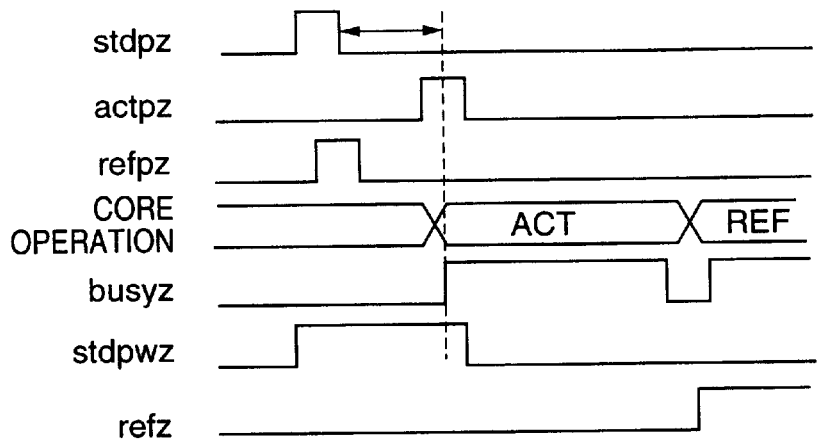
FIG. 8 is a timing chart of an operation of the semiconductor memory device shown in FIG. 7.

FIG. 8 is a timing chart of an operation of the circuit shown in FIG. 7. More particularly, FIG. 8 illustrates a case where the REF request signal refpz leads to the ACT request signal actpz. The transition detection signal stdpz generated by the transition detection circuit 41 leads to the REF request signal refz. Hence, the REF-ACT comparator circuit 43 sets the REF-ACT selection signal refz to L to thus select the active operation, and then sets the REF-ACT selection signal to H to thereby select the refresh operation. It will be noted that the conventional configuration selects the refresh operation first and the active operation send if the situation shown in FIG. 8 occurs in the conventional configuration.

The mere replacement of the input of the REF-ACT comparator circuit 43 from the ACT request signal actpz to the transition detection signal stdpz would select the refresh operation if the REF request signal is output until the ACT request signal actpz is output after the transition detection signal stdpz is output. Thus, it is necessary to disable the refresh operation until the busy signal busyz switches to H after the transition detection signal stdpz is output. The above control is implemented by a signal stdpwz, which may be obtained by expanding the pulse width of the transition detection signal stdpz. The pulse width expansion circuit 42 expands to the pulse width of the transition detection signal stdpz to thus generate the signal stdpwz.

The REF-ACT comparator circuit 43 receives the pulse-width-expanded signal stdpwz from the pulse width expansion circuit 42, and does not accept (invalidates) the REF request signal refpz as long as the signal stdpwz is ON (H). The pulse-width-expanded signal stdpwz is applied to the core control circuit 44. The refresh operation is not executed until the core control circuit 44 ends the active operation.

Figure 9:
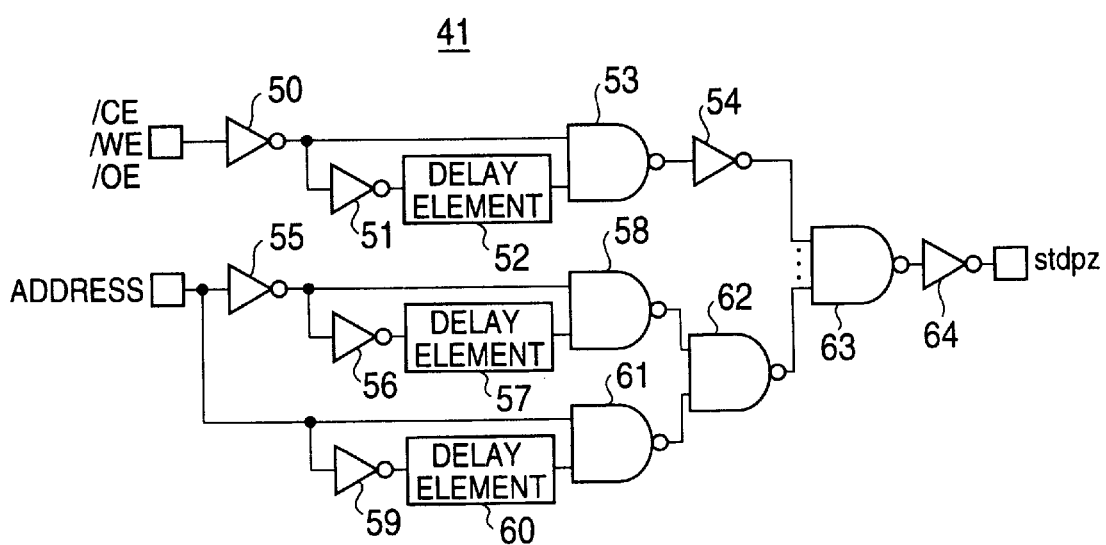
FIG. 9 is a circuit diagram of a transition detection circuit shown in FIG. 7.

FIG. 9 is a circuit diagram of a configuration of the transition detection circuit 41. The circuit 41 includes inverters 50 and 51, a delay element 52, a NAND gate 53 and an inverter 54. A plurality of detection circuits, each having the configuration shown in FIG. 9, are respectively provided to the control signals /CE, /WE and /OE. For the sake of simplicity of illustration in FIG. 9, the control signals /CE, /WE and /OE are commonly applied to the transition detection circuit. The transition detection circuit 41 includes a detection circuit made up of inverters 55 and 56, a delay element 57, and a NAND gate 58. Similarly, the circuit 41 includes another detection circuit made up of an inverter 59, a delay element 60, and a NAND gate 61. The two detection circuits related to the address signal are paired and provided for each address bit. That is, the pair of detection circuits processes a single bit of the address signal.

For example, when the chip enable signal /CE changes from H to L, the output of the inverter 50 is changed from L to H, which is received by the NAND gate 53. The output of the delay element 52 is initially H and changes to L when the delay time of the delay element lapses after the output of the inverter 50 changes to H. Thus, the output of the NAND gate 53 changes from H to L at the same time as the chip enable signal /CE changes from H to L, and returns to H after the delay time of the delay element 52. The transition detection signal stdpz is the inverted version of the output of the NAND gate 63. In short, the transition detection signal stdpz is a high-level pulse signal generated when the chip enable signal /CE changes from H to L.

Figure 3:
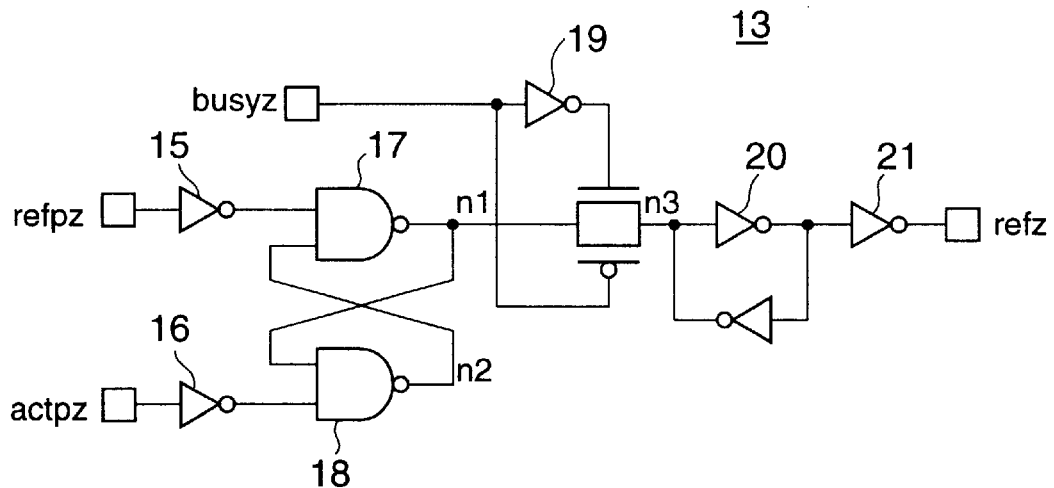
FIG. 3 is a circuit diagram of a REF-ACT selection circuit shown in FIG. 1.
Figure 10:
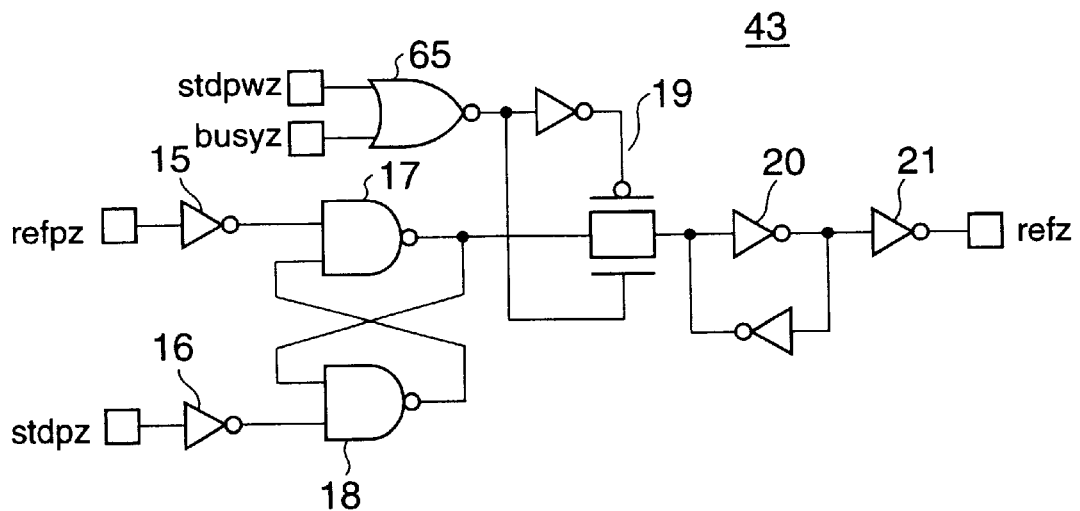
FIG. 10 is a circuit diagram of a configuration of a REF-ACT comparator circuit shown in FIG. 7.

FIG. 10 is a circuit diagram of a configuration of the REF-ACT comparator circuit 43. In FIG. 10, parts that are the same as those shown in FIG. 3 are given the same reference numbers as previously. The REF-ACT comparator circuit 43 shown in FIG. 10 is obtained by adding a NOR gate 65 to the circuit configuration shown in FIG. 3. The NOR gate 65 performs a NOR operation on the busy signal busyz and the pulse-width-expanded signal stdpwz, and controls the transfer switch 19 on the basis of the result of the NOR operation. When either the busy signal busyz or the pulse-width-expanded signal stdpwz is H, the transfer switch 19 is OFF. Hence, the REF-ACT selection signal refz is maintained. That is, the refresh operation is not accepted until the busy signal busyz changes to H after the transition detection signal stdpz is detected and during the busy period.

Figure 4:
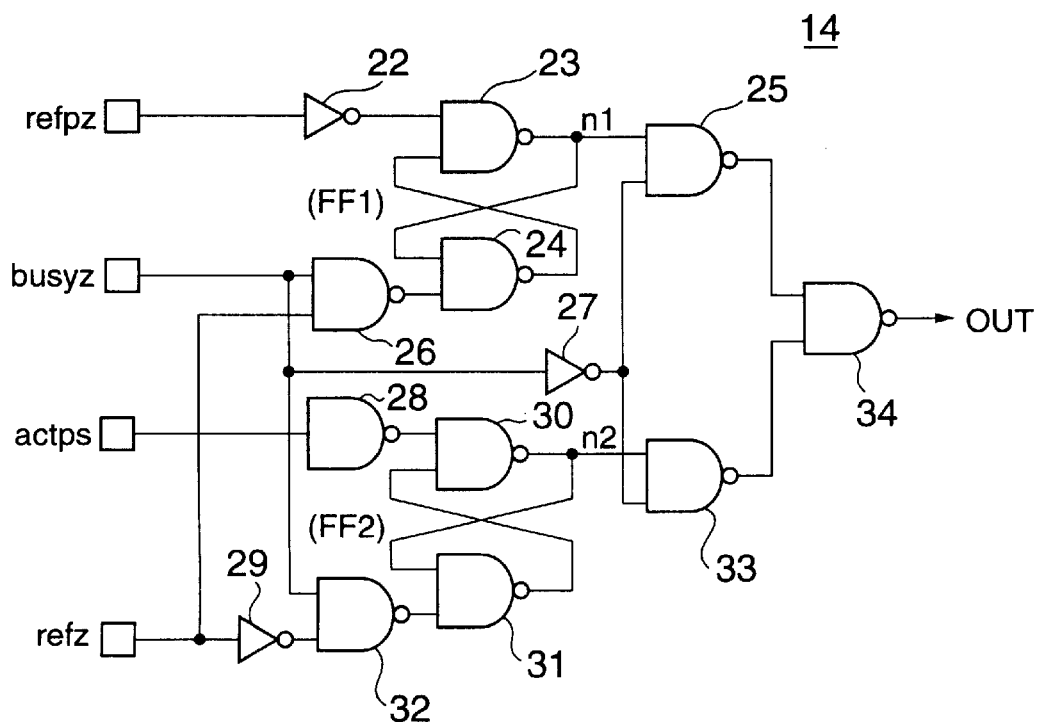
FIG. 4 is a circuit diagram of a core control circuit shown in FIG. 1.
Figure 11:
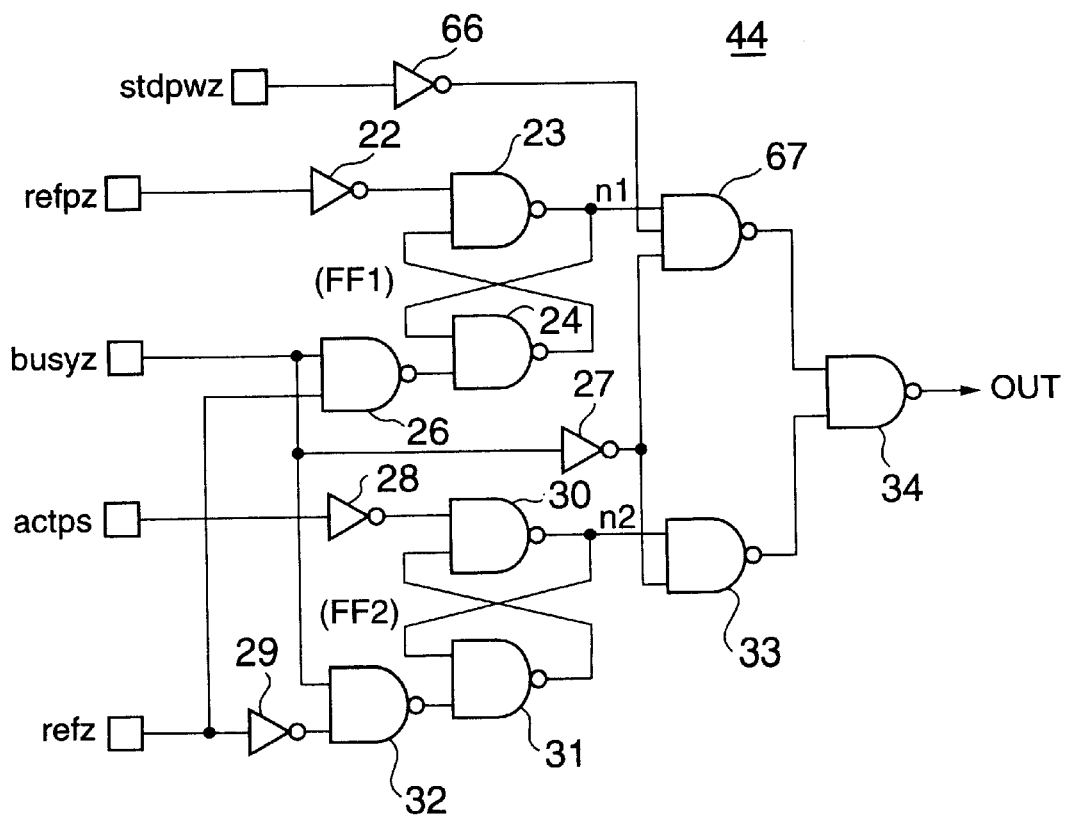
FIG. 11 is a circuit diagram of a configuration of a core control circuit shown in FIG. 7.

FIG. 11 is a circuit diagram of a configuration of the core control circuit 44. In FIG. 11, parts that are the same as those shown in FIG. 4 are given the same reference numerals as previously. The core control circuit 44 shown in FIG. 11 can be configured by modifying the circuit shown in FIG. 4 so that an inverter 66 is added thereto and a three-input NAND gate 67 is substituted for the NAND gate 25. The NAND gate 67 is closed as long as the pulse-width-expanded signal stdpwz is H. Hence, even if the REF request signal refpz is applied, there is no change of the output out of the NAND gate 34. That is, the refresh operation is not performed until the active operation ends after the transition detection signal stdpz is output.

Figure 12:
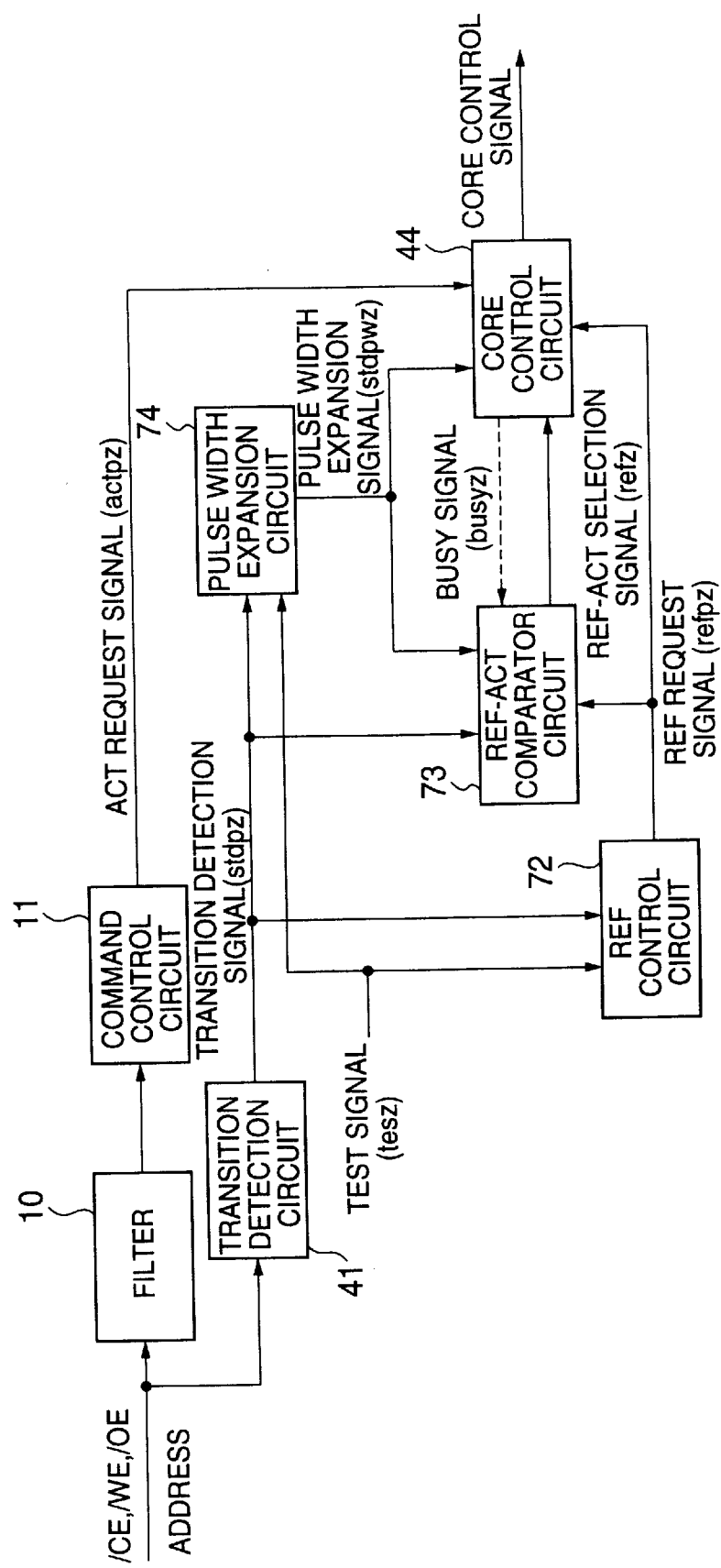
FIG. 12 is a block diagram of a second embodiment of the present invention.
Figure 13:
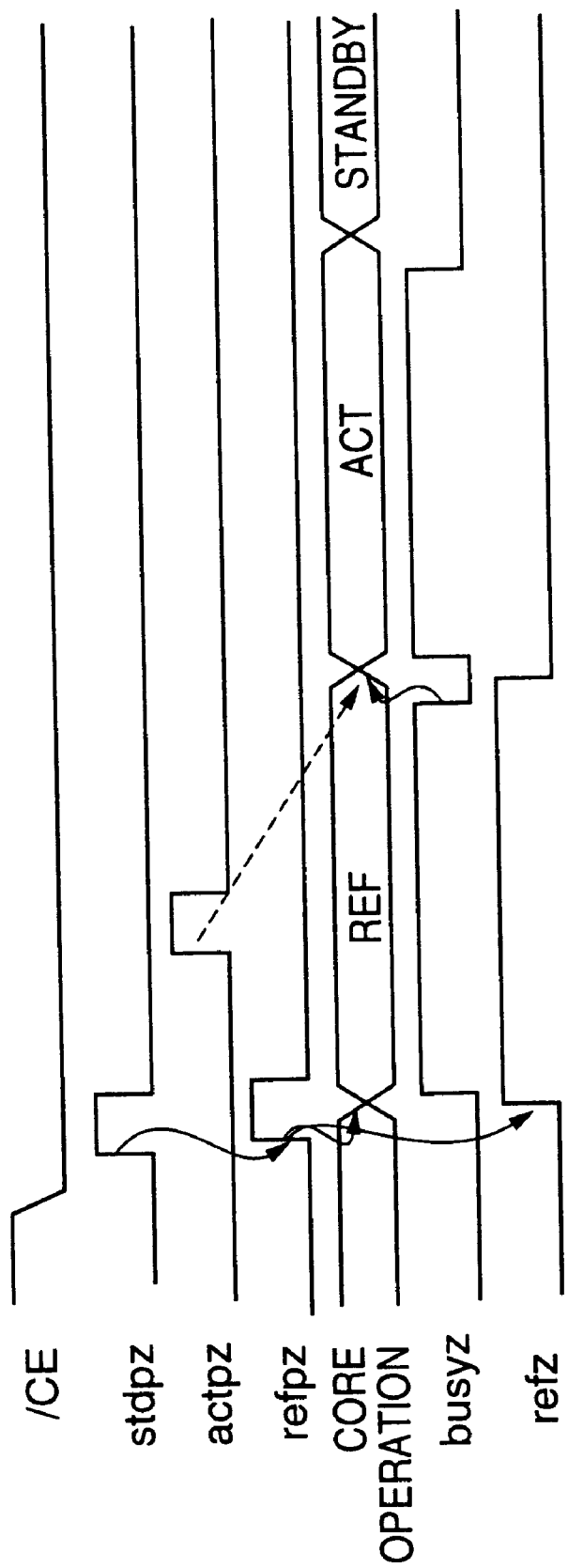
FIG. 13 is a timing chart of an operation of the semiconductor memory device shown in FIG. 12.

A description will now be given of a second embodiment of the present invention. FIG. 12 is a block diagram of a semiconductor memory device according to the second embodiment of the present invention. In FIG. 12, parts that are the same as those shown in FIG. 7 are given the same reference numbers as previously. FIG. 13 is a timing chart of an operation of the semiconductor memory device shown in FIG. 12.

The second embodiment of the present invention is configured taking the following into consideration. It is not possible to detect, from the outside of the memory device, the time at which the REF control circuit 12 generates the REF request signal refpz. When the read or write command is applied to the memory device, the corresponding active operation is performed if the refresh operation is in progress. If the refresh operation and the active operation overlap each other in term of timings, the refresh operation is executed first, and the active operation is executed second. Hence, the access time is not constant but varies. For example, as shown in FIG. 5, when the refresh operation and the active operation are almost concurrently requested, the access time is the longest. It is required to know the longest access time in order to evaluate the semiconductor memory device. However, the timing relationship as shown in FIG. 5 cannot be known from the outside of the memory device, and therefore the longest access time cannot be known.

According to the second embodiment of the present invention, a test signal is applied to the first embodiment of the present invention to set the device in a test mode. In the test mode, the refresh operation is necessarily executed in advance of an active operation requested from the outside of the device.

Referring to FIGS. 12 and 13, a test signal tesz is applied to a REF control circuit 72 and a pulse width expansion circuit 74 from the outside of the DRAM. The REF control circuit 72 generates the REF request signal refpz when the transition detection signal stdpz output by the transition detection circuit 41 switches to H in a state in which the test signal tesz has been applied to the circuit 72. A REF-ACT comparator circuit 73 receives the REF request signal refpz, and switches the REF-ACT selection signal refz to H in order to cause the core control circuit 44 to select the refresh operation. In response to a falling edge of the busy signal busyz after the refresh operation ends, the REF-ACT comparator circuit 73 sets the REF-ACT selection signal to L, and the core control circuit 44 instructs the core to execute an operation responsive to the ACT request signal actpz.

As described above, the refresh operation is executed immediately after the transition detection signal stdpz is detected in the test mode, and the active operation is then executed. Hence, it is possible to easily measure the access time (the time it takes for data to be output after the signal /CE falls) shown in FIG. 6.

Figure 14:
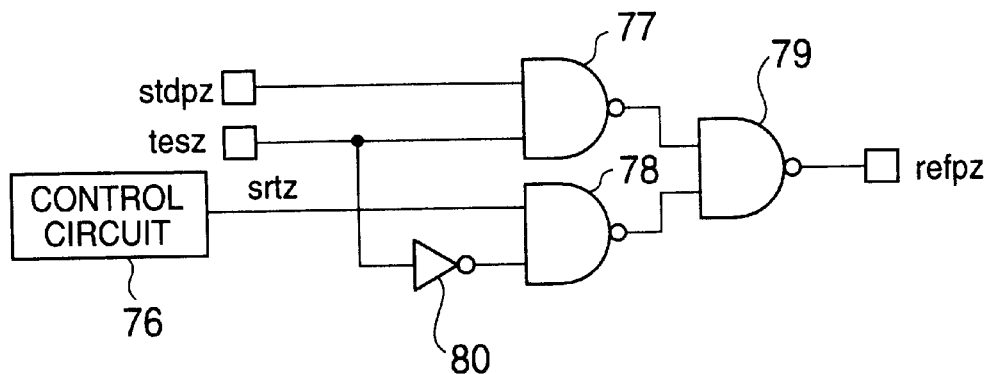
FIG. 14 is a circuit diagram of a configuration of a REF control circuit shown in FIG. 12.

FIG. 14 is a circuit diagram of a configuration of the REF control circuit 72. The circuit 72 includes a control circuit 76, NAND gates 77, 78 and 79, and an inverter 80. The control circuit 76 generates an internal refresh request signal srtz, which is supplied to the NAND gate 78. The refresh request signal refpz shown in FIG. 1 or FIG. 7 is the internal refresh signal itself. When the circuit is not in the test mode, the test signal tesz is L, and the internal refresh request signal srtz acts as the refresh request signal refpz. When the circuit is in the test mode, the test signal tesz is H. The refresh request signal refpz switches to H immediately in response to the transition detection signal stdpz.

Figure 15:
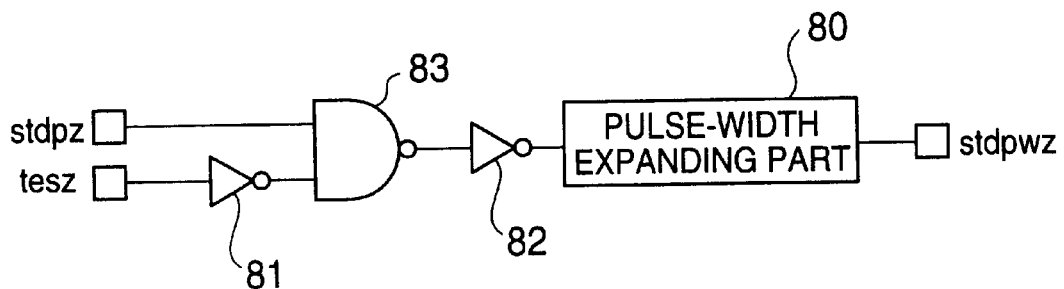
FIG. 15 is a circuit diagram of a configuration of a pulse width expansion circuit shown in FIG. 12.

FIG. 15 is a circuit diagram of a configuration of the pulse width expansion circuit 74. The circuit 74 is made up of a pulse width expanding part 80, inverters 81 and 82, and a NAND gate 83. The pulse width expanding part 80 corresponds to the pulse width expansion circuit 42 shown in FIG. 7. In the test mode, the refresh operation is executed in advance. Thus, the transition detection signal stdpz is not applied to the pulse width expanding part 80. When the circuit is not in the test mode, the transition detection signal stdpz is applied to the pulse width expanding part 80 via the NAND gate 83 and the inverter 82.

Figure 16:
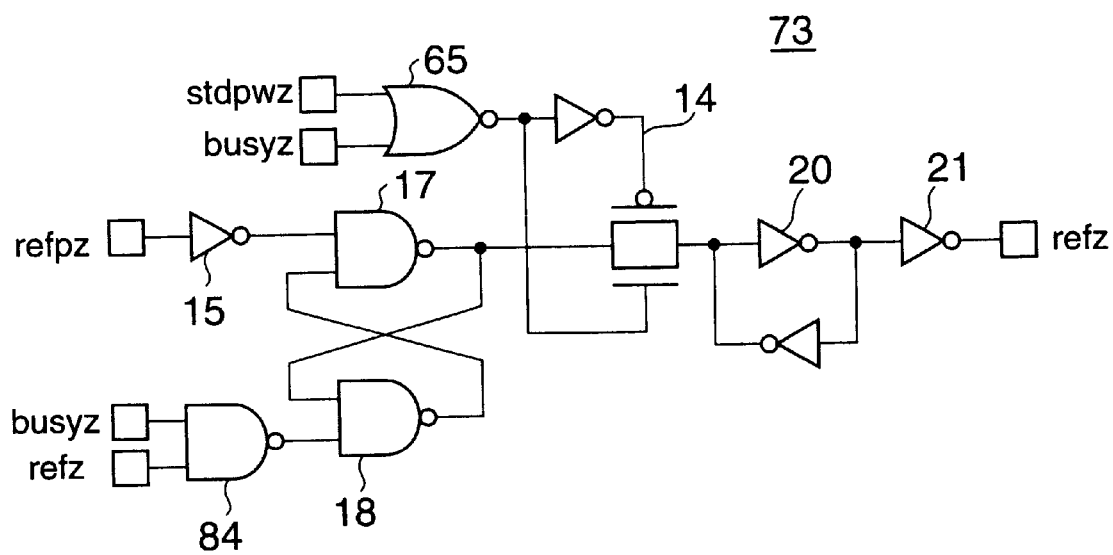
FIG. 16 is a circuit diagram of a configuration of a REF-ACT comparator circuit shown in FIG. 12.

FIG. 16 is a circuit diagram of a configuration of the REF-ACT comparator circuit 73. In FIG. 16, parts that are the same as those shown in FIG. 10 are given the same reference numerals. The circuit shown in FIG. 16 is configured by substituting a NAND gate 84 for the inverter 16 shown in FIG. 10. The NAND gate 84 is supplied with the busy signal busyz and the REF-ACT request signal refz. In the configuration shown in FIG. 10, the flip-flop composed of the NAND gates 17 and 18 is reset by the transition detection signal stdpz, and the REF-ACT selection signal refz is switched to L in the active operation. Since the transition detection signal stdpz is output in advance of the REF request signal refpz in the test mode in the test mode, the REF-ACT selection signal refz cannot be switched to L using the transition detection signal stdpz after the refresh operation. With the above in mind, the circuit configuration shown in FIG. 16 is designed so that the flip-flop is set when the circuit enters the refresh operation.

Figure 17:
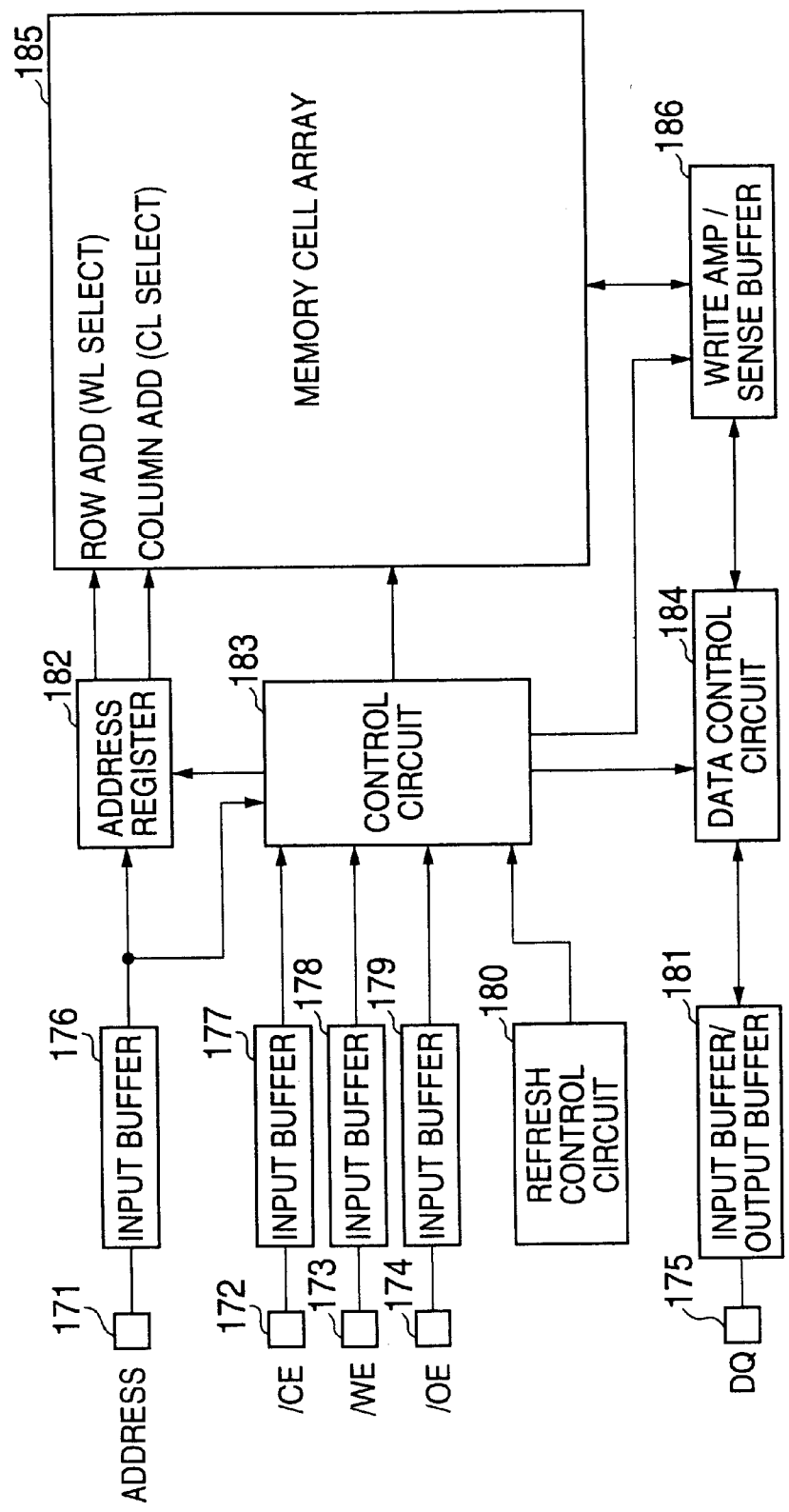
FIG. 17 is a block diagram of an example of the entire structure of the semiconductor memory device of the present invention.

FIG. 17 is a block diagram of an example of the entire structure of the semiconductor memory device of the present invention.

The memory device shown in FIG. 17 includes an address terminal 171, command input terminals 172 through 174, a data input/output terminal 175, input buffers 176 through 179 respectively connected to the terminals 171 through 174, a refresh control circuit 180 for controlling the refresh operation, an input buffer/output buffer 181, an address register 182, a control circuit 183, a data control circuit 184, a memory cell array (core) 185, and a write amplifier/sense buffer 186. The refresh control circuit 180 corresponds to the REF control circuit 12 shown in FIG. 7 and the REF control circuit 72 shown in FIG. 12. An external address is received via the address terminal 171 and the input buffer 176, and decoded addresses in the row and column systems are applied to the memory cell array 185. The control signals /CE, /WE and /OE are applied to the control circuit 183 via the input buffers 177, 178 and 179, respectively. The data input/output circuit 184 controls inputting/outputting of data under the control of the control circuit 183.

The present invention is not limited to the specifically disclosed embodiments, and variations and modifications may be made without departing from the scope of the present invention.

The present application is based on Japanese priority application no. 2000-054882 filed on Feb. 29, 2000, the entire contents of which are hereby incorporated by reference.

What is claimed is:

1. A semiconductor memory device having a self-refresh operation comprising:
   a transition detection circuit generating a transition detection signal when detecting a transition of one of control signals and an address signal; and
   a comparator circuit comparing the transition detection signal with a refresh request signal internally generated and generating a selection signal having a logic level depending on a result of the comparison and being indicative of a self-refresh operation or an operation according to the transition.

2. The semiconductor memory device as claimed in claim 1, further comprising a circuit generating a signal that invalidates the refresh request signal internally generated until the given input signal is processed in the semiconductor memory device after the detection signal is generated.

3. The semiconductor memory device as claimed in claim 1, wherein the detection circuit receives the given input signal which is not filtered through a filter provided in the semiconductor memory device.

4. The semiconductor memory device as claimed in claim 1, wherein the control signal generated by the comparator circuit selects a circuit operation indicated by a signal applied to the comparator circuit in advance.

5. The semiconductor memory device as claimed in claim 1, wherein the given input signal includes a signal related to a command.

6. The semiconductor memory device as claimed in claim 1, wherein the given input signal includes a signal related to an address.

7. A semiconductor memory device having a self-refresh operation comprising:
   a transition detection circuit generating a transition detection signal when detecting a transition of one of control signals and an address signal; and
   a refresh control circuit generating a refresh request signal based on both the transition detection signal and an externally generated test signal, said refresh request signal requesting execution of the self-refresh operation in a test mode.

8. The semiconductor memory device as claimed in claim 7, further comprising a comparator circuit that compares the detection signal with the refresh request signal and generates a resultant signal indicative of a circuit operation.

9. The semiconductor memory device as claimed in claim 7, wherein the refresh control circuit outputs the detection signal as the refresh request signal in the test mode, and outputs another refresh request signal internally generated as the refresh request signal when the semiconductor memory device is not in the test mode.

10. The semiconductor memory device as claimed in claim 7, further comprising a circuit generating a signal that invalidates the refresh request signal internally generated until the given input signal is processed in the semiconductor memory device after the detection signal is generated.

11. A semiconductor memory device comprising:
   a transition detection circuit generating a transition detection signal upon detecting of a transition of one of control signals and an address signal;
   a noise filter filtering noises of the control signals;
   a command control circuit coupled to the noise filter for generating an operation request signal responsive to the control signals;
   a comparator circuit comparing a timing of the transition detection signal with a timing of an internal refresh request signal and generating a selection signal indicative of a self-refresh operation or an operation according to the transition and;
   an operation control circuit receiving the operation request signal, the internal refresh request signal and the selection signal and outputting a control signal indicative of the self-refresh operation or the operation according to the transition.

* * * * *